(12) United States Patent
Sheu et al.

(10) Patent No.: US 8,218,361 B2
(45) Date of Patent: Jul. 10, 2012

(54) DATA PROGRAMMING CIRCUITS AND MEMORY PROGRAMMING METHODS

(75) Inventors: Shyh-Shyuan Sheu, Taichung (TW); Lieh-Chiu Lin, Kaohsiung (TW); Pei-Chia Chiang, Taipei (TW); Wen-Pin Lin, Dacun Township, Changhua County (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 13/215,491

(22) Filed: Aug. 23, 2011

(65) Prior Publication Data

US 2011/0317483 A1 Dec. 29, 2011

Related U.S. Application Data

(62) Division of application No. 12/275,223, filed on Nov. 21, 2008, now Pat. No. 8,031,515.

(30) Foreign Application Priority Data

Nov. 26, 2007 (TW) .............................. 96144739 A

(51) Int. Cl.
*G11C 11/00* (2006.01)
(52) U.S. Cl. .................................. 365/163; 365/189.16
(58) Field of Classification Search .................. 365/163, 365/189.16, 185.03
See application file for complete search history.

(56) References Cited

U.S. PATENT DOCUMENTS 4,225,946 A * 9/1980 Neale et al. .................... 365/163

* cited by examiner

*Primary Examiner* — Vu Le
(74) *Attorney, Agent, or Firm* — Wang Law Firm, Inc.; Li K. Wang

(57) ABSTRACT

A data programming circuit for storing a writing data into a memory cell is provided. The data programming circuit includes a control circuit and a current generating circuit. The control circuit generates a control signal according to the writing data. The current generating circuit provides a writing current to the memory cell to change a crystalline state of the memory cell. The writing current has a pulse width corresponding to the writing data, and the crystalline state corresponds to the writing data.

9 Claims, 14 Drawing Sheets

DATA PROGRAMMING CIRCUITS AND MEMORY PROGRAMMING METHODS

CROSS REFERENCE TO RELATED APPLICATIONS

This application is a divisional of co-pending U.S. application Ser. No. 12/275,223 filed on Nov. 21, 2008, the entirety of which is incorporated by reference herein.

BACKGROUND OF THE INVENTION

1. Field of the Invention

The invention relates to a data programming circuit, and more particularly to a data programming circuit of a memory.

2. Description of the Related Art

A Phase Change Memory (PCM) is a non-volatile memory with high speed, high capacity and low energy consumption, wherein a plurality of PCM cells of the PCM cell is formed by phase change material, such as chalcogenide etc. The phase change material can be switched between two states, a crystalline state and an amorphous state, with the application of heat, wherein the phase change material has different resistances corresponding to the crystalline and amorphous states respectively, wherein the resistances respectively represent different stored data.

In general, the PCM cell has a relatively high resistance in an amorphous state, which may be used to represent that a data stored in the PCM cell is a binary bit "0". On the contrary, the PCM cell has a relatively low resistance in a crystalline state, which may be used to represent that a data stored in the PCM cell is a binary bit "1".

However, for a PCM with a plurality of multi-level memory cells, each memory cell stores at least two-bits data (such as "00", "01", "10" and "11"). The multi-level PCM cell needs four different crystalline states in order to represent or identify the two-bits data stored in the PCM cell. Hence, for a PCM cell, the complexity of a programming method is increased when a category of the crystalline state is increased.

BRIEF SUMMARY OF THE INVENTION

Data programming circuits and memory programming methods are provided. An exemplary embodiment of such a data programming circuit for storing a writing data into a memory cell is provided. The data programming circuit includes a control circuit and a current generating circuit. The control circuit generates a control signal according to the writing data. The current generating circuit provides a writing current to the memory cell to change a crystalline state of the memory cell, wherein the writing current has a pulse width corresponding to the writing data, and the crystalline state corresponds to the writing data.

Furthermore, an exemplary embodiment of a data programming circuit for storing a writing data into a memory cell is provided. The data programming circuit includes a control circuit and a current generating circuit. The control circuit generates a first current according to the writing data. The current generating circuit provides a writing current to the memory cell to change a crystalline state of the memory cell according to the first current, wherein the writing current has a pulse amplitude corresponding to the writing data, and the crystalline state corresponds to the writing data.

Moreover, an exemplary embodiment of a memory programming method for programming a memory cell is provided. A writing data is received. A first writing current is provided to the memory cell according to the writing data, wherein a first pulse width, a first pulse amplitude or combinations thereof of the first writing current corresponds to the writing data. A crystalline state of the memory cell is changed according to the first writing current, wherein the crystalline state corresponds to the writing data.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
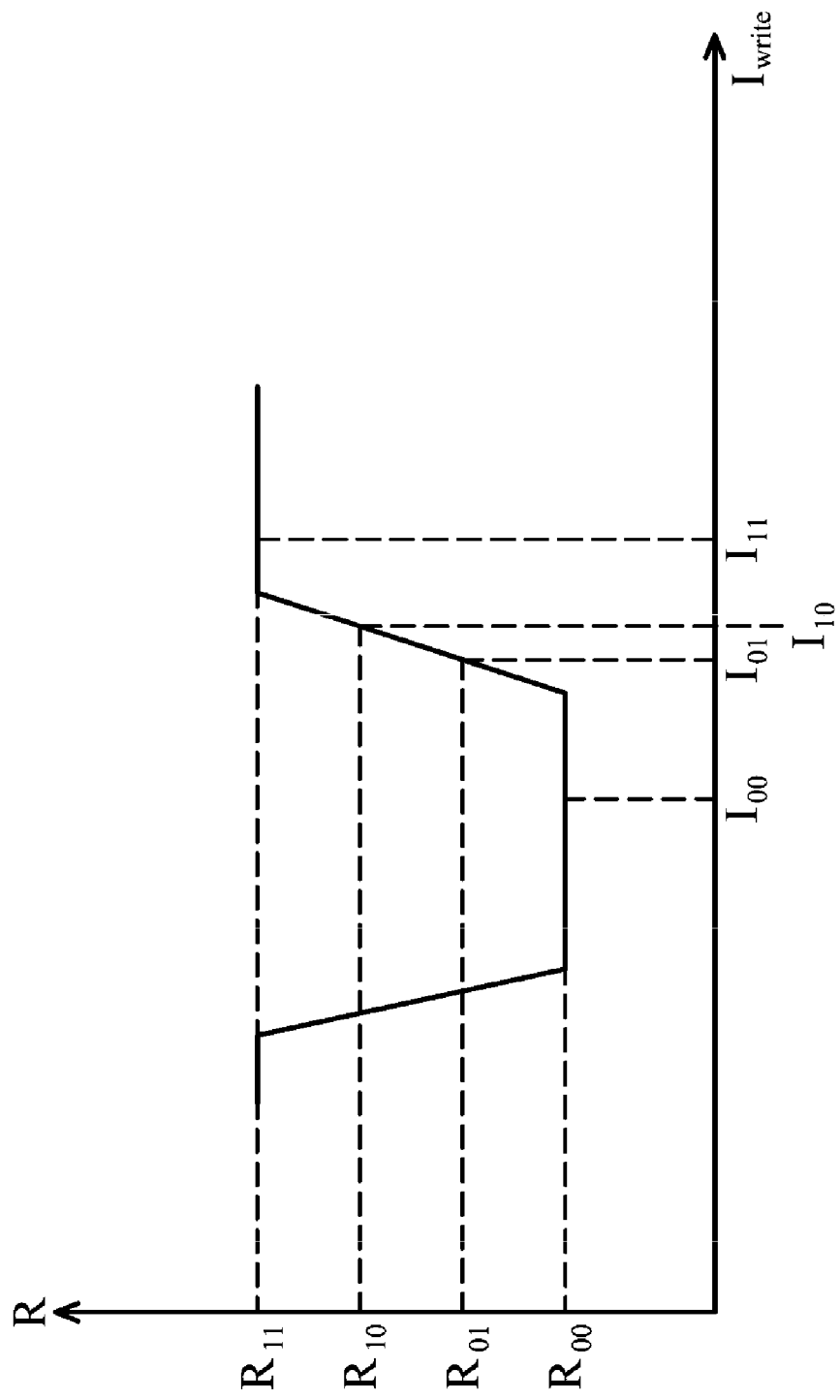
FIG. 1 shows a characteristic diagram of a writing current and a resistance of a multi-level PCM cell according to an embodiment of the invention.

FIG. 1 shows a characteristic diagram of a writing current and a resistance of a multi-level PCM cell according to an embodiment of the invention. A programming method of the invention may provide a current to heat a PCM cell to change a resistance of the PCM cell such that a data may be stored into the PCM cell. As shown in FIG. 1, if a current value of the writing current $I_{write}$ is equal to $I_{00}$, $I_{01}$, $I_{10}$ and $I_{11}$ respectively, the resistance of the PCM cell may be changed to $R_{00}$, $R_{01}$, $R_{10}$ and $R_{11}$ to store the two-bits data "00", "01", "10" and "11" into the PCM cell, respectively.

Figure 2:
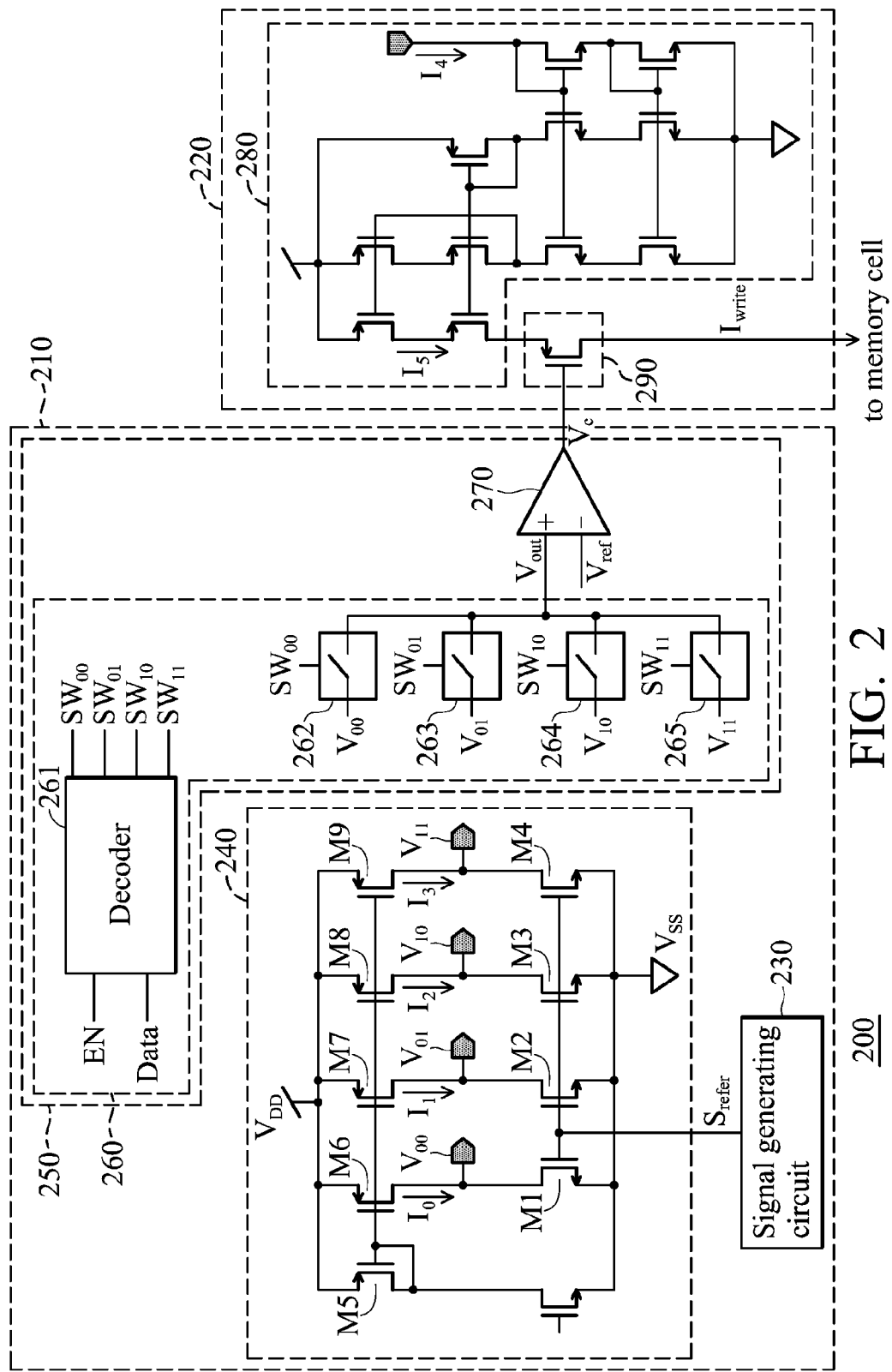
FIG. 2 shows a data programming circuit according to an embodiment of the invention.

FIG. 2 shows a data programming circuit 200 according to an embodiment of the invention. A writing data Data is stored into a PCM cell by a writing current $I_{write}$, wherein the data programming circuit 200 includes a control circuit 210 and a current generating circuit 220. The control circuit 210 includes a signal generating circuit 230, a voltage generating circuit 240 and an output circuit 250. The signal generating circuit 230 substantially functions as a waveform generator to provide a reference signal $S_{refer}$, which may be a square wave or a triangular wave (or a ramp wave) having a predetermined period. In the voltage generating circuit 240, four currents $I_0$, $I_1$, $I_2$ and $I_3$ may be obtained by adjusting a size ratio of the transistor M5 to the transistors M6, M7, M8 and M9, wherein $I_0 < I_1 < I_2 < I_3$. In one embodiment, the voltage generating circuit 240 uses four current sources to generate the currents $I_0$, $I_1$, $I_2$ and $I_3$. The reference signal $S_{refer}$ is coupled to each gate of the transistors M1, M2, M3 and M4, and controls a turned-on/turned-off state of each transistor to generate the voltage signals $V_{00}$, $V_{01}$, $V_{10}$ and $V_{11}$. When the transistors M1, M2, M3 and M4 are turned on, the voltage signals $V_{00}$, $V_{01}$, $V_{10}$ and $V_{11}$ have different amplitudes due to the currents $I_0$, $I_1$, $I_2$ and $I_3$ flowed through the corresponding transistors have different current values. Furthermore, the currents $I_0$, $I_1$, $I_2$ and $I_3$ may also affect the rising and falling time of the voltage signals $V_{00}$, $V_{01}$, $V_{10}$ and $V_{11}$. The voltage signals $V_{00}$, $V_{01}$, $V_{10}$ and $V_{11}$ respectively correspond to the writing data Data with values "00", "01", "10" and "11". For example, the voltage signal $V_{01}$ corresponds to the writing data Data with value "01".

The output circuit 250 includes a selecting circuit 260 and a comparator 270, wherein the selecting circuit 260 includes a decoder 261 and four switches 262, 263, 264 and 265. In the selecting circuit 260, the decoder 261 may decode the writing data Data to generate four signals $SW_{00}$, $SW_{01}$, $SW_{10}$ and $SW_{11}$ according to a enable signal EN, wherein the signals $SW_{00}$, $SW_{01}$, $SW_{10}$ and $SW_{11}$ are coupled to the switches 262, 263, 264 and 265, respectively. The selecting circuit 260 may select one of the voltage signals $V_{00}$, $V_{01}$, $V_{10}$ and $V_{11}$ as an output voltage $V_{out}$ according to the writing data Data. For example, if the writing data Data has the value "10", the switch 264 may be turned on by the signal $SW_{10}$ such that the voltage signal $V_{10}$ is transmitted to an output terminal of the selecting circuit 260 as the output voltage $V_{out}$. Next, the comparator 270 may compare the output voltage $V_{out}$ with a voltage $V_{ref}$ to generate a control signal $V_c$. Thus, the output circuit 250 may generate the control signal $V_c$ according to the writing data Data and the voltage signals $V_{00}$, $V_{01}$, $V_{10}$ and $V_{11}$.

The current generating circuit 220 includes a current mirror circuit 280 and a switch 290. The current mirror circuit 280 receives a current $I_4$ to generate a current $I_5$, wherein a ratio of the current $I_4$ to the current $I_5$ is determined by the sizes of the transistors in the current mirror circuit 280. The switch 290 is coupled between the current mirror circuit 280 and a PCM cell (not shown), and a turned-on/turned-off state of the switch 290 is controlled by the control signal $V_c$ to provide the writing current $I_{write}$ to the PCM cell to change a crystalline state of the PCM cell, wherein the writing current $I_{write}$ has a pulse width corresponding to the writing data Data. The invention may apply to other types of memories in addition to a phase change memory.

Figure 3:
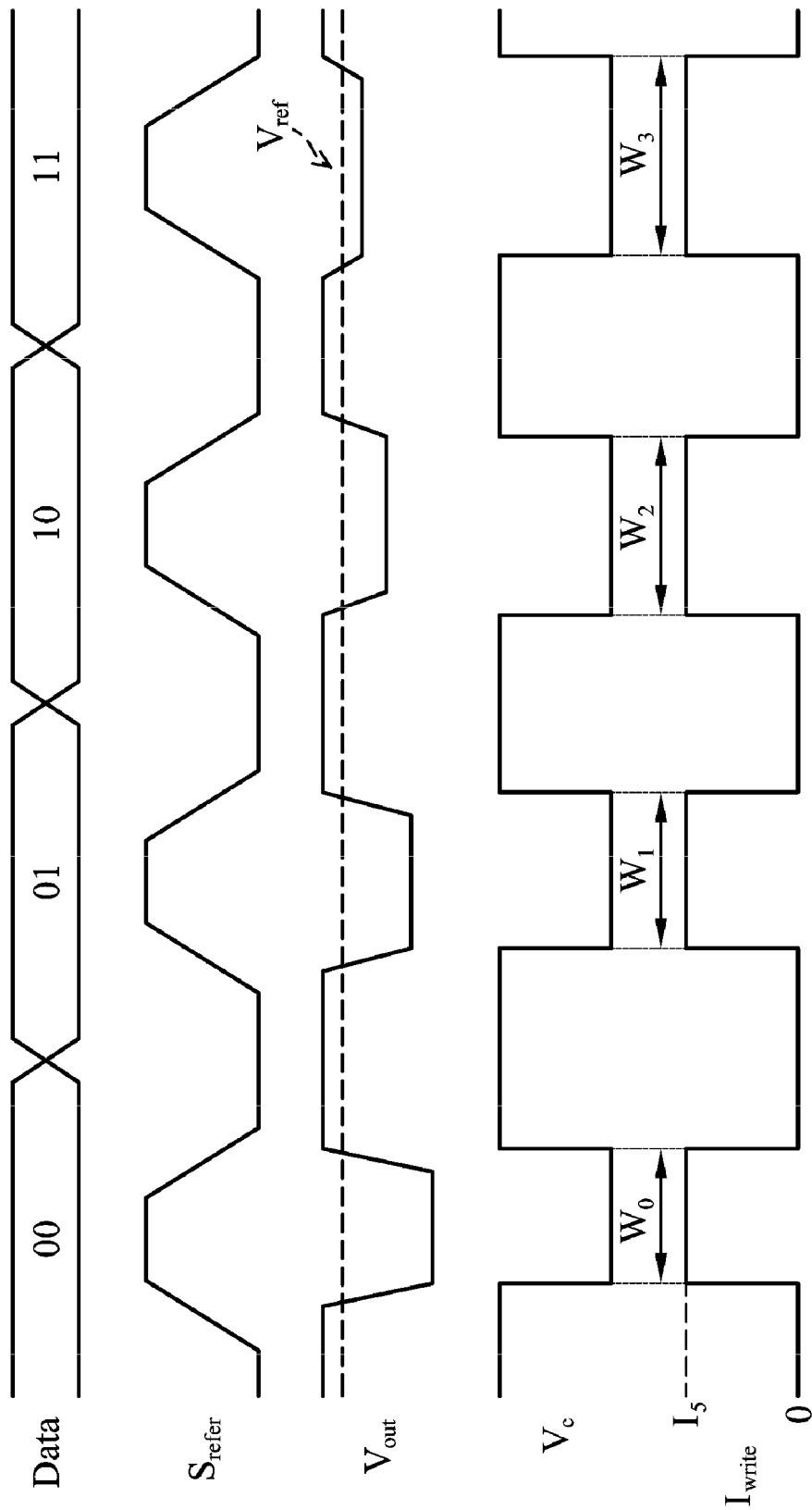
FIG. 3 shows a waveform diagram of the signals in the data programming circuit shown in FIG. 2.

FIG. 3 shows a waveform diagram of the signals in the data programming circuit 200 shown in FIG. 2. As shown in the writing data Data, data values "00", "01", "10" and "11" are programmed into the PCM cell sequentially. Next, the voltage signals $V_{00}$, $V_{01}$, $V_{10}$ and $V_{11}$ are sequentially transmitted to the output terminal of the selecting circuit 260 as the output voltage $V_{out}$. The control signal $V_c$ has a variable pulse width which is generated by the comparator 270 because to the output voltage $V_{out}$ may have a variable pulse amplitude, rising time and falling time. In one embodiment, the switch 290 may be a P type metal oxide semiconductor (MOS) transistor. Hence, if the control signal $V_c$ is at a low voltage level, the switch 290 is turned on and the current $I_5$ is transmitted to the PCM cell as the writing current $I_{write}$, wherein a pulse width of the writing current $I_{write}$ is determined by a pulse width of the control signal $V_c$. In FIG. 3, the writing current $I_{write}$ corresponding to the programming value "11" has a maximum pulse width because of $W_0 < W_1 < W_2 < W_3$. Moreover, for the writing current $I_{write}$ respectively corresponding to the pulse widths $W_0$, $W_1$, $W_2$ and $W_3$, the average current values are equal to the current values $I_{00}$, $I_{01}$, $I_{10}$ and $I_{11}$ respectively, as shown in FIG. 1.

Figure 4:
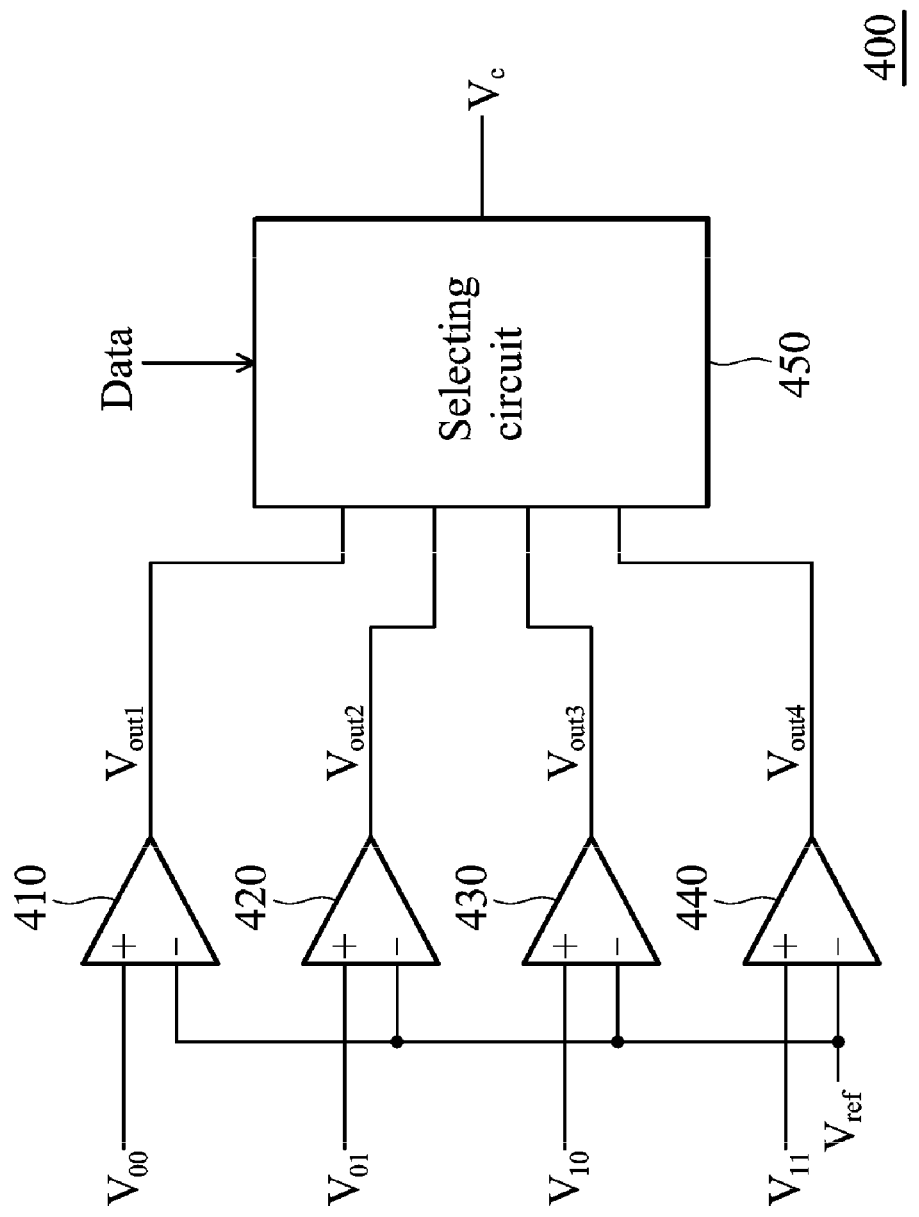
FIG. 4 shows an output circuit according to an embodiment of the invention.

FIG. 4 shows an output circuit 400 according to an embodiment of the invention. The output circuit 400 includes four comparators 410, 420, 430 and 440 and a selecting circuit 450. The comparators 410, 420, 430 and 440 compare the voltage $V_{ref}$ with the voltage signals $V_{00}$, $V_{01}$, $V_{10}$ and $V_{11}$ to generate the output signals $V_{out1}$, $V_{out2}$, $V_{out3}$ and $V_{out4}$, respectively. Next, the selecting circuit 450 receives the four output signals and selects one of the output signals $V_{out1}$, $V_{out2}$, $V_{out3}$ and $V_{out4}$ as the control signal $V_c$ according to the writing data Data. In one embodiment, the selecting circuit 450 may be a multiplexer.

Figure 5:
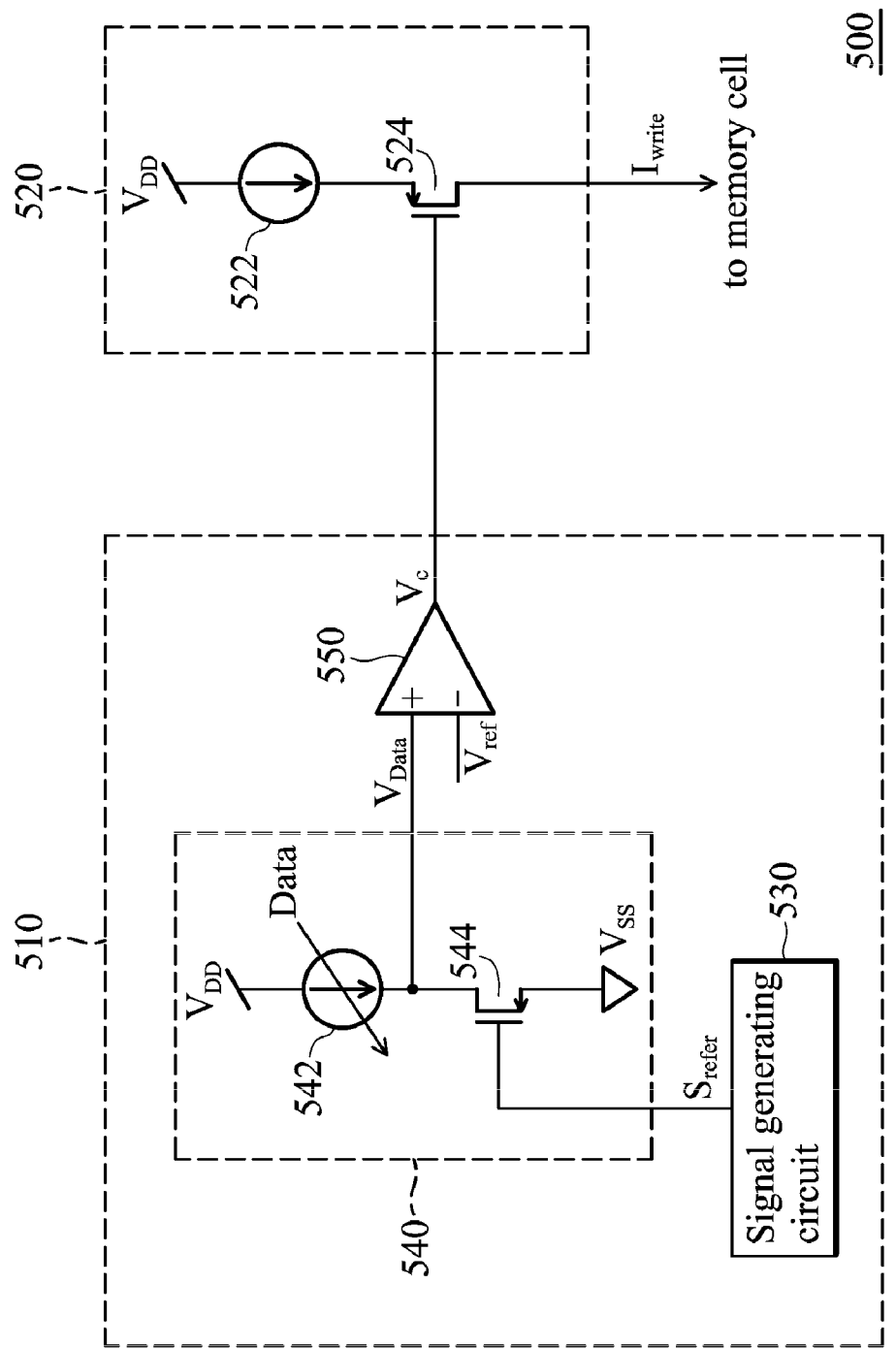
FIG. 5 shows a data programming circuit according to another embodiment of the invention.

FIG. 5 shows a data programming circuit 500 according to another embodiment of the invention. The data programming circuit 500 includes a control circuit 510 and a current generating circuit 520. The control circuit 510 includes a signal generating circuit 530, a voltage generating circuit 540 and a comparator 550. Compared to the voltage generating circuit 240 in FIG. 2, the voltage generating circuit 540 includes a variable current source 542 and a transistor 544. The variable current source 542 may provide a current corresponding to the writing data Data, such as the currents $I_0$, $I_1$, $I_2$ and $I_3$ shown in FIG. 2. In addition, the transistor 544 is coupled between the variable current source 542 and a ground $V_{SS}$ and generates a voltage signal $V_{Data}$ according to the current corresponding to the writing data Data and a reference signal $S_{refer}$. Next, the comparator 550 may compare the voltage signal $V_{Data}$ with the voltage $V_{ref}$ to generate a control signal $V_c$. Compared to the current generating circuit 220 in FIG. 2, the current generating circuit 520 includes a current source 522 and a transistor 524, wherein the current source 522 functions as the current mirror circuit 280 shown in FIG. 2.

In one embodiment, the control circuit may only use a logic circuit to simplify its design, wherein the logic circuit may generate the control signal $V_c$ with a specific pulse width corresponding to the writing data Data.

Figure 6:
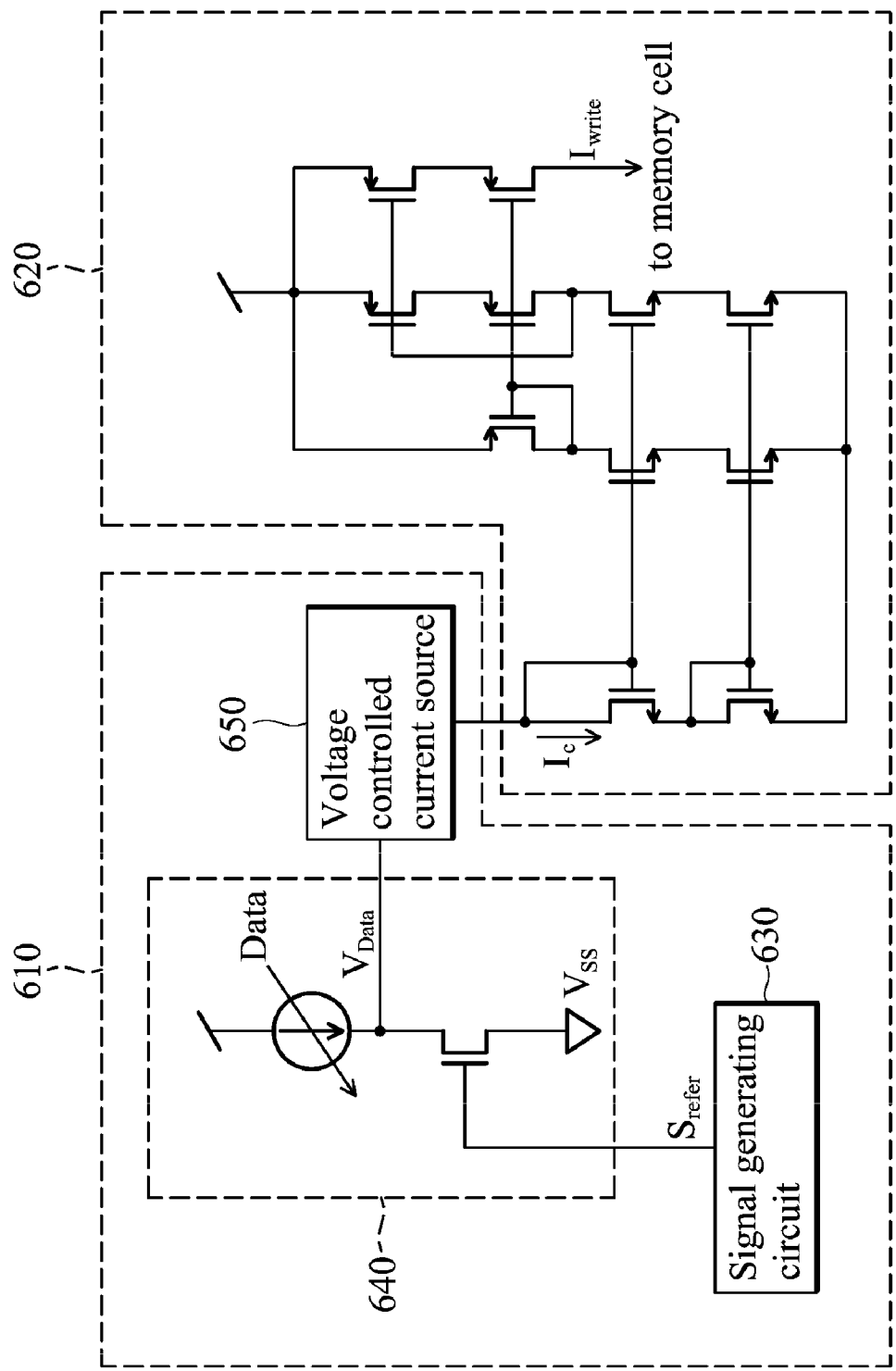
FIG. 6 shows a data programming circuit according to another embodiment of the invention.

FIG. 6 shows a data programming circuit according to another embodiment of the invention. The data programming circuit includes a control circuit 610 and a current generating circuit 620, wherein the current generating circuit 620 includes a current mirror circuit. The control circuit 610 includes a signal generating circuit 630, a voltage generating circuit 640 and a voltage controlled current source (VCCS) 650. According to a voltage signal $V_{Data}$, the VCCS 650 may generate a current $I_c$ which has a pulse amplitude corresponding to the writing data Data. The current generating circuit 620 may provide a writing current $I_{write}$ to a PCM cell to change a crystalline state of a PCM cell according to the current $I_c$, wherein a ratio of the current $I_c$ to the writing current $I_{write}$ is determined by the sizes of the transistors within the current mirror circuit. In one embodiment, the data programming circuit may also use the voltage generating circuit 240 and the selecting circuit 260 as shown in FIG. 2 to provide the output voltage $V_{out}$ to the VCCS 650. Next, the VCCS 650 may generate the current $I_c$ corresponding to the writing data Data to the current generating circuit 620 according to the output voltage $V_{out}$.

Figure 7:
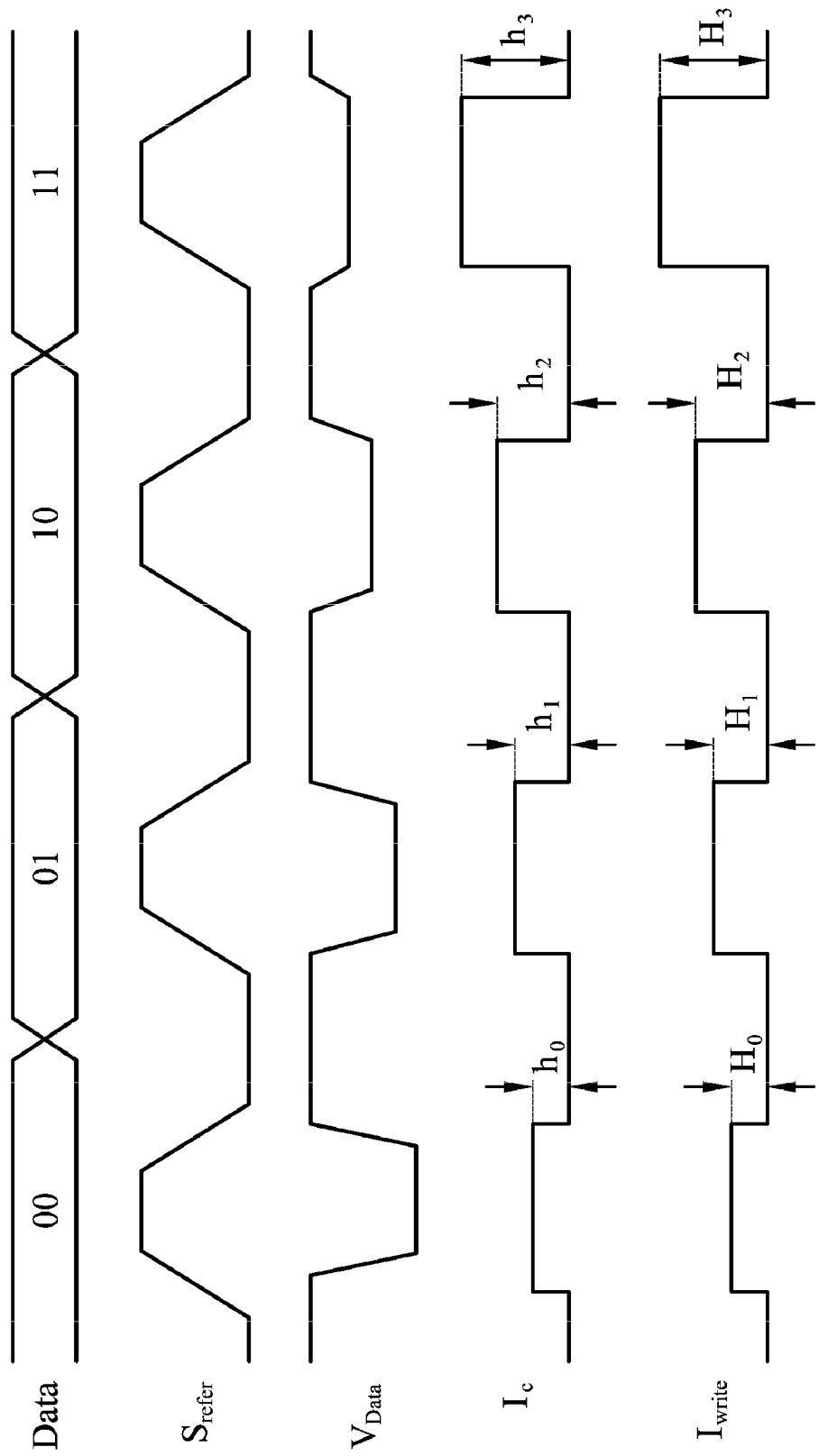
FIG. 7 shows a waveform diagram of the signals in the data programming circuit shown in FIG. 6.

FIG. 7 shows a waveform diagram of the signals in the data programming circuit shown in FIG. 6. As shown in the writing data Data, data values "00", "01", "10" and "11" are programmed into the PCM cell sequentially. Next, the voltage generating circuit 640 may generate a voltage signal $V_{Data}$ with a amplitude corresponding to the value of the writing data Data. The VCCS 650 receives the voltage signal $V_{Data}$ and generates the current $I_c$ according to the voltage signal $V_{Data}$. The current $I_c$ has a pulse amplitude which is variable, wherein $h_0 < h_1 < h_2 < h_3$. The current generating circuit 620 may provide the writing current $I_{write}$ having a variable amplitude according to the current $I_c$, wherein a ratio of the current $I_c$ to the writing current $I_{write}$ is equal to N. In FIG. 7, the writing current $I_{write}$ corresponding to the programming value "00" has a minimum pulse amplitude $H_0$, i.e. $H_0 = N \times h_0$. Moreover, for the writing current $I_{write}$ respectively corresponding to the pulse widths $H_0$, $H_1$, $H_2$ and $W_3$, the average current values are equal to the current values $I_{00}$, $I_{01}$, $I_{10}$ and $I_{11}$ respectively, as shown in FIG. 1.

Figure 8A:
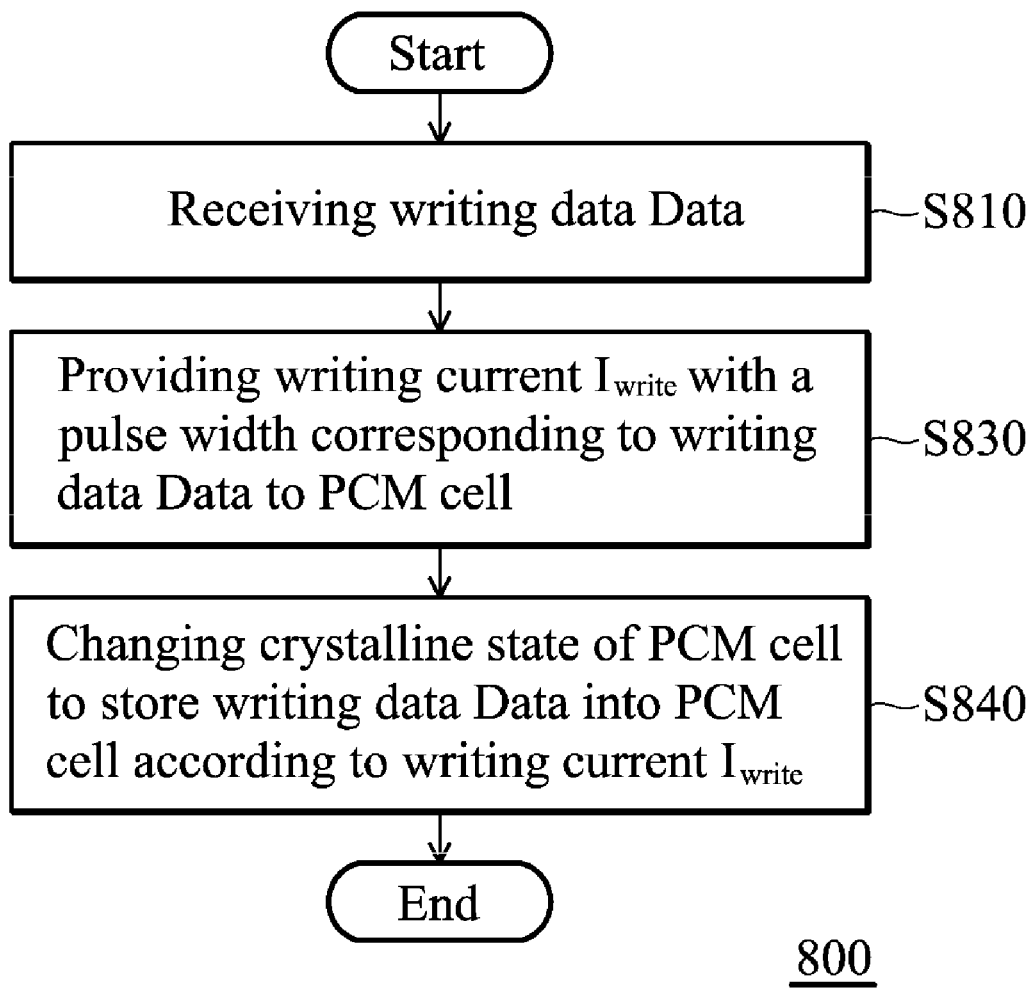
FIG. 8A shows a memory programming method according to an embodiment of the invention.
Figure 8B:
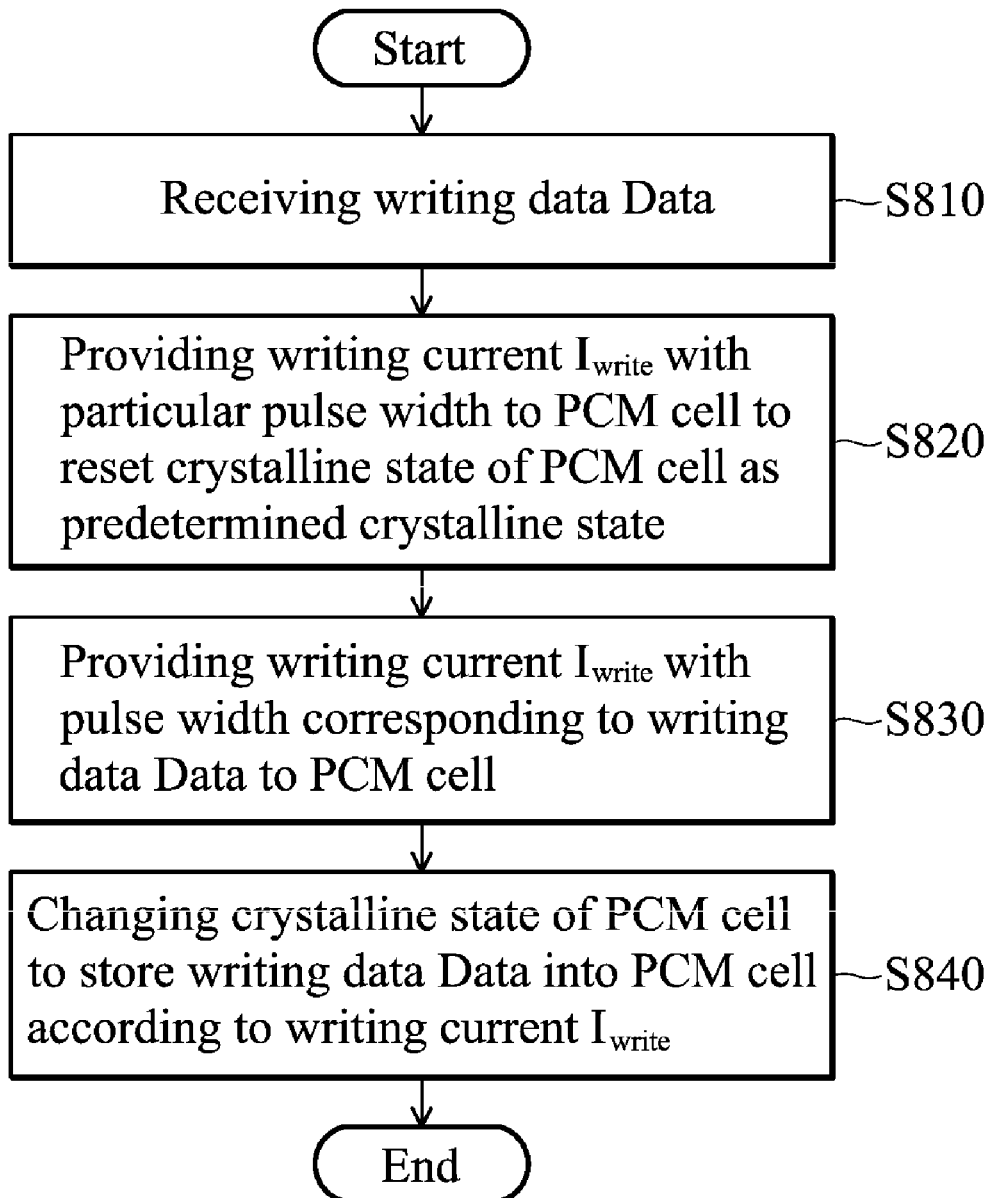
FIG. 8B shows a memory programming method according to another embodiment of the invention.

FIG. 8A shows a memory programming method 800 according to an embodiment of the invention. First, in step S810, a writing data Data is received by a data programming circuit. Next, in step S830, the data programming circuit may provide a writing current $I_{write}$ to a PCM cell according to the writing data Data, wherein the writing current $I_{write}$ has a pulse width corresponding to the writing data Data. Finally, in step S840, a crystalline state of the PCM cell is changed by the writing current $I_{write}$ and the writing data Data is stored into the PCM cell, wherein the crystalline state of the PCM cell corresponds to the writing data Data. FIG. 8B shows a memory programming method 850 according to another embodiment of the invention. Compared to the memory programming method 800 shown in FIG. 8A, step S820 is added between the steps S810 and S830 of the memory programming method 850. In step S820, the writing current $I_{write}$ with a particular pulse width is provided to the PCM cell to reset the crystalline state of the PCM cell as a predetermined crystalline state. In one embodiment, no matter what value of the writing data Data is, such as "00", "01", "10" or "11", the writing current $I_{write}$ corresponding to the value "11" of the writing data Data is provided to the PCM cell to reset the PCM cell in advance. For example, if the writing data Data with the value "01" is programmed into the PCM cell, the writing current $I_{write}$ with the pulse width $W_3$ (as shown in FIG. 3, i.e. the pulse width corresponding to writing data Data with the value "11") is provided to the PCM cell to first reset its crystalline state. Next, the writing current $I_{write}$ with the pulse width $W_1$ (as shown in FIG. 3, i.e. the pulse width corresponding to writing data Data with the value "01") is provided to the PCM cell to store the value "01" into the PCM cell.

Figure 9A:
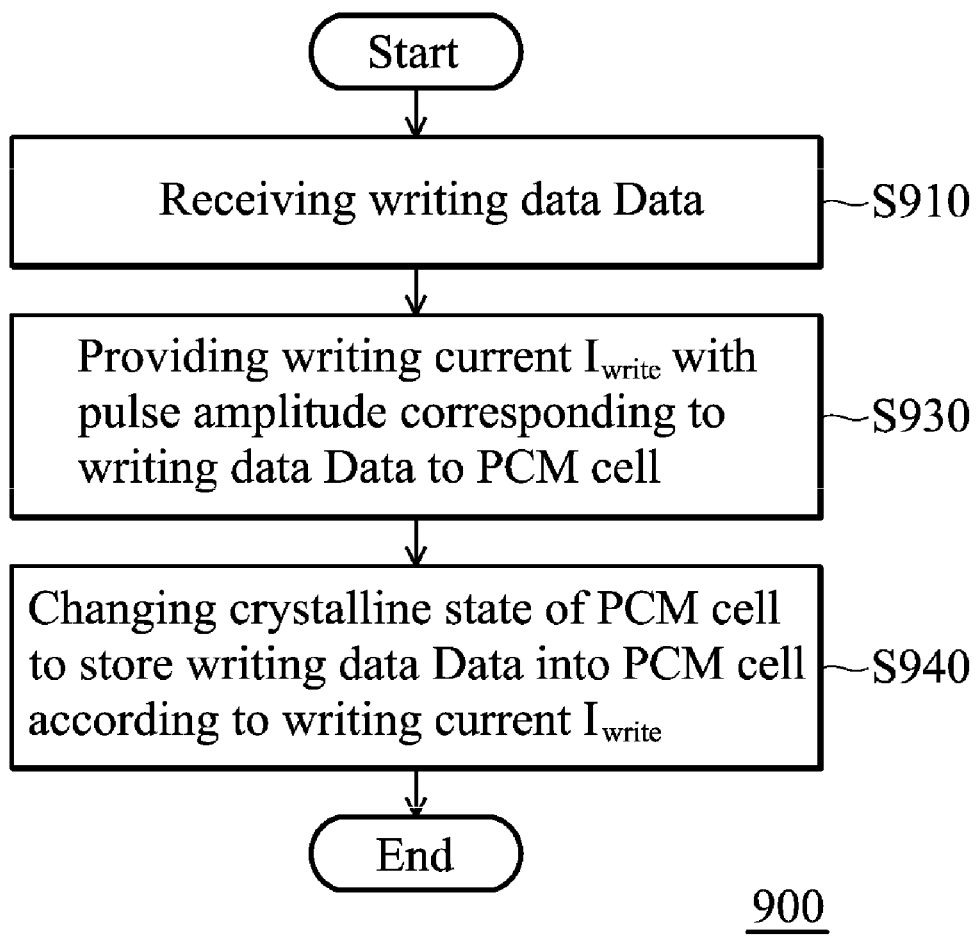
FIG. 9A shows a memory programming method according to another embodiment of the invention.
Figure 9B:
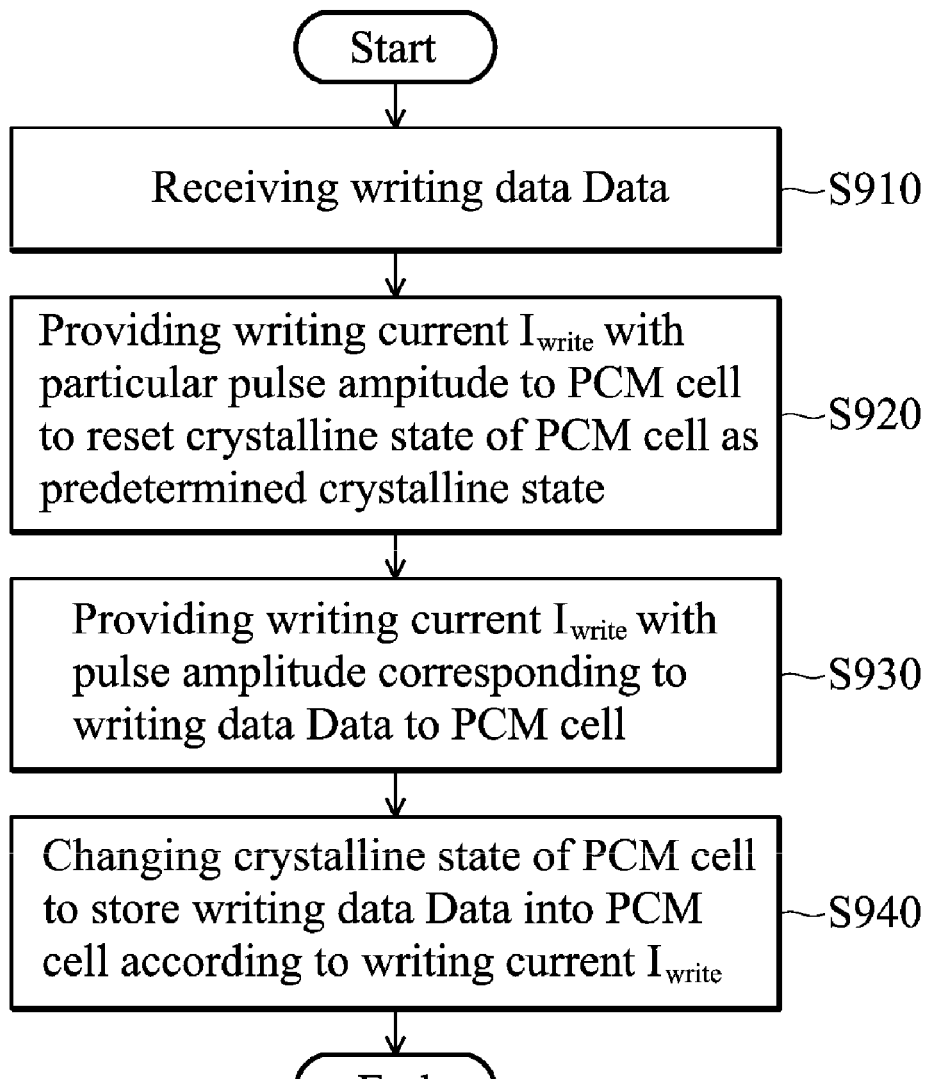
FIG. 9B shows a memory programming method according to another embodiment of the invention.

FIG. 9A shows a memory programming method 900 according to another embodiment of the invention. First, in step S910, a writing data Data is received by a data programming circuit. Next, in step S930, the data programming circuit may provide a writing current $I_{write}$ to a PCM cell according to the writing data Data, wherein the writing current $I_{write}$ has a pulse amplitude corresponding to the writing data Data. Finally, in step S940, a crystalline state of the PCM cell is changed by the writing current $I_{write}$ and the writing data Data is stored into the PCM cell, wherein the crystalline state of the PCM cell corresponds to the writing data Data. FIG. 9B shows a memory programming method 950 according to another embodiment of the invention. Compared to the memory programming method 900 shown in FIG. 9A, step S920 is added between the steps S910 and S930 of the memory programming method 950. In step S920, the writing current $I_{write}$ with a particular pulse width is provided to the PCM cell to reset the crystalline state of the PCM cell as a predetermined crystalline state. In one embodiment, no matter what value of the writing data Data is, such as "00", "01", "10" or "11", the writing current $I_{write}$ corresponding to the value "11" of the writing data Data is provided to the PCM cell to reset the PCM cell in advance. For example, if the writing data Data with the value "00" is programmed into the PCM cell, the writing current $I_{write}$ having a pulse amplitude corresponding the writing data Data with the value "11" is provided to the PCM cell to reset its crystalline state first. Next, the writing current $I_{write}$ having a pulse amplitude corresponding the writing data Data with the value "00" is provided to the PCM cell to store the value "00" into the PCM cell.

Figure 10A:
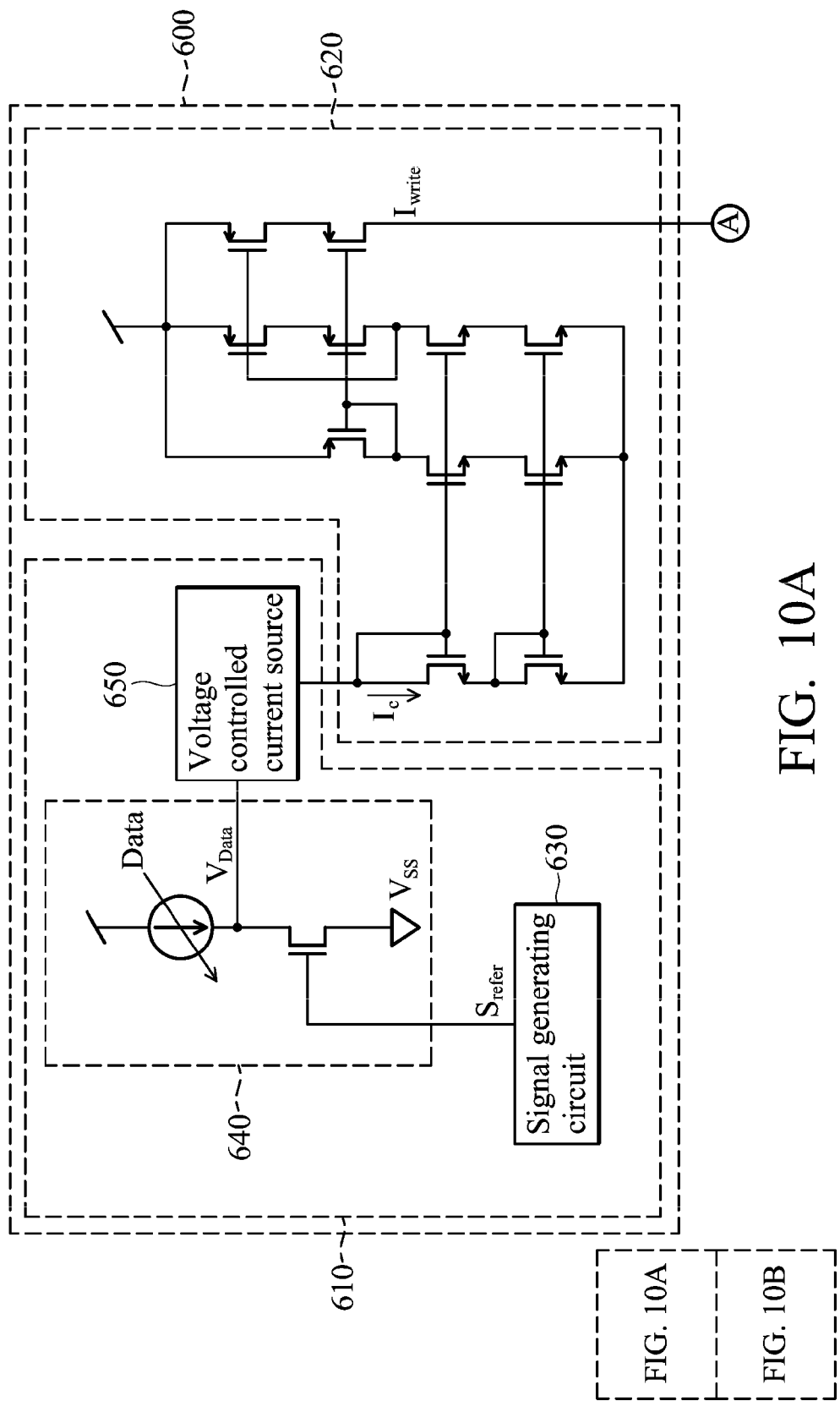
FIGS. 10A and 10B show a data programming circuit according to an embodiment of the invention.
Figure 10B:
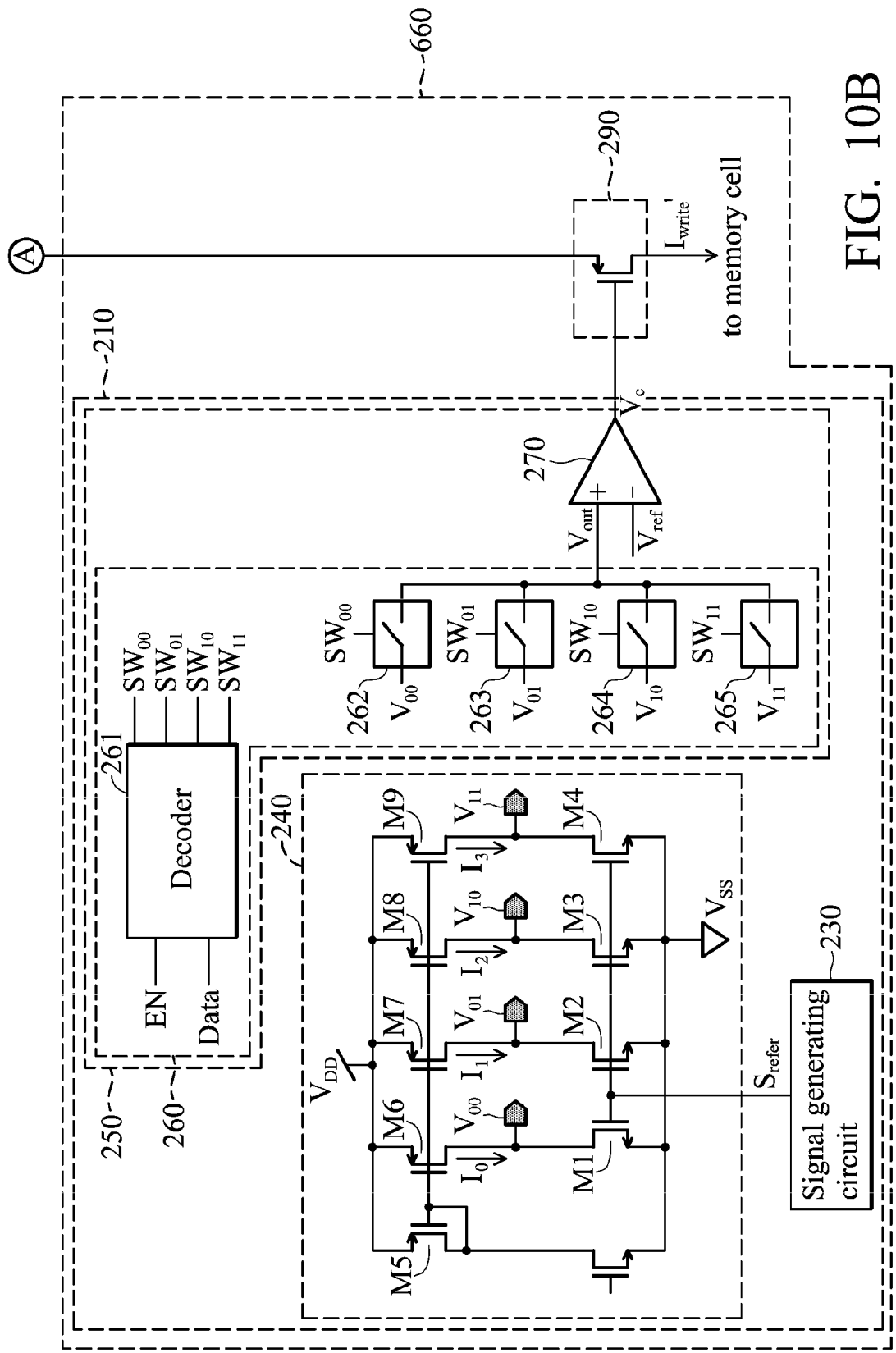

FIGS. 10A and 10B show a data programming circuit according to an embodiment of the invention, wherein the data programming system includes a circuit 600 and a modulation circuit 660. In FIG. 10A, the circuit 600 may provide a writing current $I_{write}$ according to a current $I_c$, wherein the writing current $I_{write}$ has the pulse amplitude corresponding to the writing data Data. Next, in FIG. 10B, the modulation circuit 660 receives the writing current $I_{write}$ and generates a writing current $I_{write}'$, wherein the writing current $I_{write}'$ has a pulse width corresponding to the writing data Data. In this embodiment, the modulation circuit 660 includes the control circuit 210 and the switch 290 (as shown in FIG. 2), wherein the control circuit 210 may generate the control signal $V_c$ according to the writing data Data. Next, a turned-on/turned-off state of the switch 290 is controlled by the control signal $V_c$ to provide the writing current $I_{write}'$ to a PCM cell to change a crystalline state of the PCM cell, wherein the writing current $I_{write}'$ has a pulse width and a pulse amplitude both corresponding to the writing data Data. In another embodiment, the writing current $I_{write}$ generated by the current generating circuit 220 of FIG. 2 may also be used by a modulation circuit (not shown, a functionality of the modulation circuit is similar to the modulation circuit 660) to generate the writing current $I_{write}'$ with the pulse width and the pulse amplitude both corresponding to the writing data Data to a PCM cell to change a crystalline state of the PCM cell.

Figure 11:
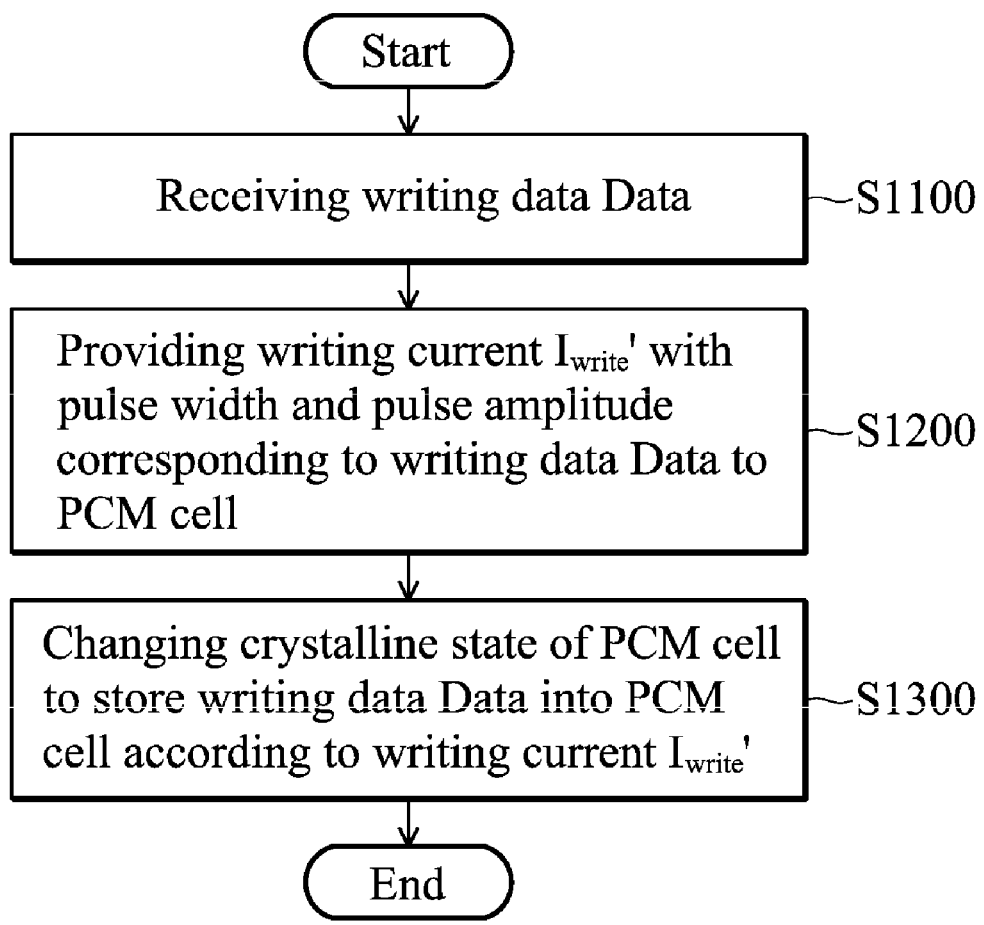
FIG. 11 shows a memory programming method according to another embodiment of the invention.

FIG. 11 shows a memory programming method according to another embodiment of the invention. First, in step S1100, a writing data Data is received by a data programming circuit. Next, in step S1200, the data programming circuit may provide a writing current $I_{write}'$ to a PCM cell according to the writing data Data, wherein the writing current $I_{write}'$ has a pulse width and a pulse amplitude both corresponding to the writing data Data. Finally, in step S1300, a crystalline state of the PCM cell is changed by the writing current $I_{write}'$ and the writing data Data is stored into the PCM cell, wherein the crystalline state of the PCM cell corresponds to the writing data Data.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A data programming circuit for storing a writing data into a memory cell, comprising:
   a control circuit, generating a first current according to the writing data; and
   a current generating circuit, providing a writing current to the memory cell to change a crystalline state of the memory cell according to the first current, wherein the writing current has a pulse amplitude corresponding to the writing data, and the crystalline state corresponds to the writing data.

2. The data programming circuit as claimed in claim 1, wherein the current generating circuit comprises a current mirror circuit for receiving the first current to provide the writing current, wherein a ratio of the first current to the writing current is determined by the current mirror circuit.

3. The data programming circuit as claimed in claim 1, wherein the control circuit comprises:
   a signal generating circuit, providing a reference signal with a predetermined waveform;
   a voltage generating circuit, generating a plurality of voltage signals according to the reference signal, wherein each of the voltage signals corresponds to the writing data with a specific value; and
   a voltage controlled current source, generating the first current according to the writing data and the voltage signal corresponding to the writing data, wherein the first current has the pulse amplitude.

4. The data programming circuit as claimed in claim 3, wherein the predetermined waveform is a square wave or a triangular wave.

5. The data programming circuit as claimed in claim 1, wherein the control circuit comprises:
   a signal generating circuit, providing a reference signal with a predetermined waveform;
   a voltage generating circuit, generating a voltage signal according to the reference signal and the writing data; and
   a voltage control current source, generating the first current according to the voltage signal, wherein the first current has the pulse amplitude.

6. The data programming circuit as claimed in claim 5, wherein the voltage generating circuit comprises:
   a variable current source, providing a second current corresponding to the writing data; and
   a transistor coupled between the variable current source and a ground, having a gate for receiving the reference signal, wherein the transistor provides the voltage signal according to the second current and the reference signal.

7. The data programming circuit as claimed in claim 5, wherein the predetermined waveform is a square wave or a triangular wave.

8. The data programming circuit as claimed in claim 1, wherein the memory cell is a phase change memory cell.

9. The data programming circuit as claimed in claim 1, further comprising a modulation circuit for modulating the writing current such that the writing current has a pulse width corresponding to the writing data.

* * * * *